United States Patent
Kudo et al.

(10) Patent No.: US 6,992,958 B2
(45) Date of Patent: Jan. 31, 2006

(54) PHASE-LOCKED LOOP CIRCUIT FOR REPRODUCING A CHANNEL CLOCK

(75) Inventors: Mamoru Kudo, Kanagawa (JP); Shinobu Nakamura, Kanagawa (JP)

(73) Assignee: Sony Corporation, (JP)

( * ) Notice: Subject to any disclaimer, the term of this patent is extended or adjusted under 35 U.S.C. 154(b) by 455 days.

(21) Appl. No.: 10/000,347

(22) Filed: Dec. 4, 2001

(65) Prior Publication Data
US 2002/0105365 A1    Aug. 8, 2002

(30) Foreign Application Priority Data
Dec. 5, 2000    (JP)    ............... P2000-374695

(51) Int. Cl.
*G11B 7/00*    (2006.01)

(52) U.S. Cl. .................... 369/47.3; 369/53.2
(58) Field of Classification Search ............. 369/47.28, 369/47.3, 53.2
See application file for complete search history.

(56) References Cited
U.S. PATENT DOCUMENTS

| | | | | |
|---|---|---|---|---|
| 3,895,294 A | * | 7/1975 | Vinding | ............... 324/76.82 |
| 4,550,345 A | * | 10/1985 | Terada et al. | ............... 386/28 |
| 5,128,809 A | * | 7/1992 | Leis et al. | ............... 360/51 |
| 5,469,417 A | * | 11/1995 | Tanoue et al. | ............... 369/47.28 |
| 6,028,828 A | * | 2/2000 | Maeda | ............... 369/47.4 |
| 6,118,742 A | * | 9/2000 | Matsui et al. | ............... 369/47.48 |
| RE36,933 E | * | 10/2000 | Shimada | ............... 369/59 |
| 6,144,627 A | * | 11/2000 | Muto | ............... 369/30.21 |
| 6,317,395 B1 | * | 11/2001 | Yamamoto et al. | ............... 369/44.35 |
| 6,381,204 B1 | * | 4/2002 | Kobayashi et al. | ............... 369/47.3 |

* cited by examiner

*Primary Examiner*—Gautam R. Patel
(74) *Attorney, Agent, or Firm*—Rader, Fishman & Grauer PLLC; Ronald P. Kananen

(57) ABSTRACT

In PLL circuits for reproducing a channel clock in synchronism with data read from a disk-shaped recording medium driven for rotation, the frequency dividing ratio of frequency dividers provided in desired signal paths is made changeable according to the reproduced signal format of a CD reproduced signal or a DVD reproduced signal, for example. Although the frequency of the channel clock in synchronism with the reproduced signal differs in different signal formats, the above configuration makes it possible to reproduce the channel clock properly in accordance with a plurality of signal formats only by the operation of changing the frequency dividing ratio in a PLL circuit.

5 Claims, 8 Drawing Sheets

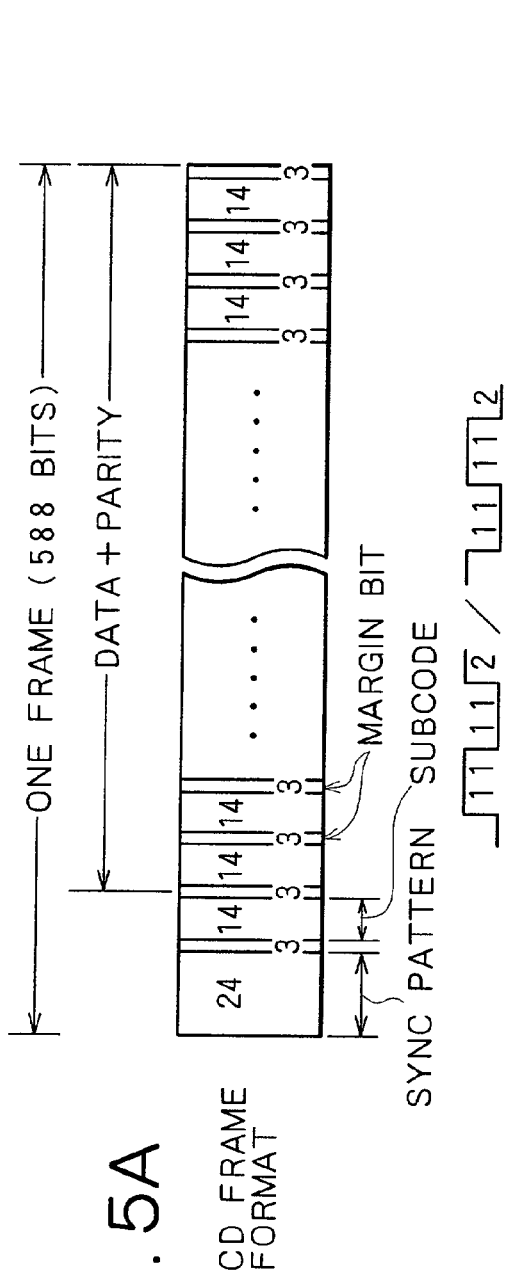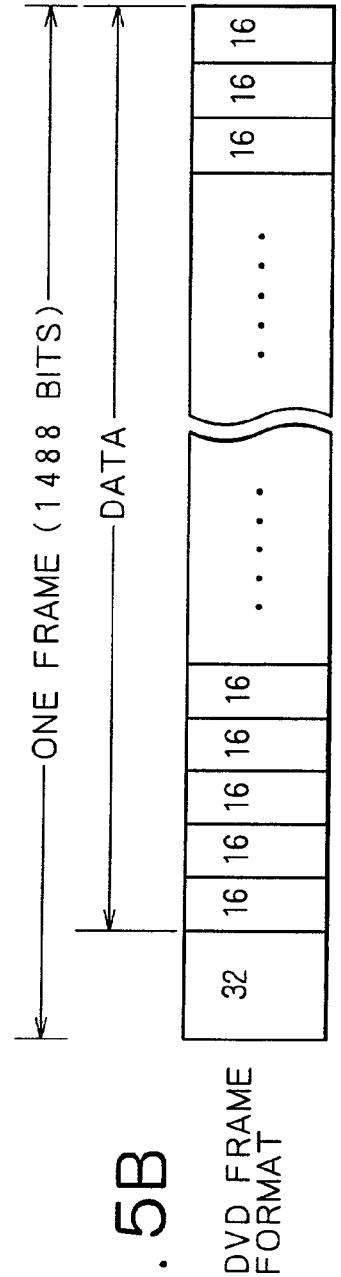

|  |  | (MSB)                            (LSB) |
|---|---|---|
| State1 | SY0 | 0001001001000100 0000000000010001 |
|  | SY1 | 0000010000000100 0000000000010001 |
|  | SY2 | 0001000000000100 0000000000010001 |
|  | SY3 | 0000100000000100 0000000000010001 |
|  | SY4 | 0010000000000100 0000000000010001 |
|  | SY5 | 0010001001000100 0000000000010001 |
|  | SY6 | 0010010010000100 0000000000010001 |
|  | SY7 | 0010010001000100 0000000000010001 |
| State2 | SY0 | 0001001000000100 0000000000010001 |
|  | SY1 | 0000010001000100 0000000000010001 |
|  | SY2 | 0001000001000100 0000000000010001 |
|  | SY3 | 0000100001000100 0000000000010001 |
|  | SY4 | 0010000001000100 0000000000010001 |
|  | SY5 | 0010001000000100 0000000000010001 |
|  | SY6 | 0010000010000100 0000000000010001 |
|  | SY7 | 0010010000000100 0000000000010001 |
| State3 | SY0 | 1001001000000100 0000000000010001 |
|  | SY1 | 1000010001000100 0000000000010001 |
|  | SY2 | 1001000001000100 0000000000010001 |
|  | SY3 | 1000001001000100 0000000000010001 |
|  | SY4 | 1000100001000100 0000000000010001 |
|  | SY5 | 1000100100000100 0000000000010001 |
|  | SY6 | 1001000010000100 0000000000010001 |
|  | SY7 | 1000100010000100 0000000000010001 |
| State4 | SY0 | 1001001001000100 0000000000010001 |
|  | SY1 | 1000010000000100 0000000000010001 |
|  | SY2 | 1001000000000100 0000000000010001 |
|  | SY3 | 1000001000000100 0000000000010001 |
|  | SY4 | 1000100000000100 0000000000010001 |
|  | SY5 | 1000000100000100 0000000000010001 |
|  | SY6 | 1000000001000100 0000000000010001 |
|  | SY7 | 1000000010000100 0000000000010001 |

FIXED PATTERN OF 14T + 4T

FIG. 7

| | | |
|---|---|---|
| CD | RF SIGNAL PATTERN | 3T~11T |
| | CHANNEL CLOCK FREQUENCY (fck) | 4.3218MHz |
| | SYNC FRAME LENGTH (Tsync) | 588T |
| | SYNC FRAME FREQUENCY (fsync) | 7.35kHz |
| | SYNC CODE PATTERN | FIXED PATTERN OF 11T+11T+2T |
| | Xtal | 16.9344MHz |
| | CHANNEL CLOCK GENERATION REFERENCE SIGNAL | 16.9344MHz±α |
| DVD | RF SIGNAL PATTERN | 3T~11T, 14T |
| | CHANNEL CLOCK FREQUENCY (fck) | 26.16MHz |
| | SYNC FRAME LENGTH (Tsync) | 1488T |
| | SYNC FRAME FREQUENCY (fsync) | ABOUT 17.58kHz |
| | SYNC CODE PATTERN | 32T PATTERN INCLUDING 14T+4T (32 TYPES) |
| | Xtal | 16.9344MHz |
| | CHANNEL CLOCK GENERATION REFERENCE SIGNAL | 16.9344MHz±α |

FIG.8

| m × n | Ps1 | Ps2 |
|---|---|---|
| 33 | 1.0312 | 0.970 |
| 34 | 1.0625 | 0.999 |
| 35 | 1.0938 | 1.029 |
| 36 | 1.1250 | 1.058 |

PHASE-LOCKED LOOP CIRCUIT FOR REPRODUCING A CHANNEL CLOCK

BACKGROUND OF THE INVENTION

The present invention relates to a phase-locked loop circuit for reproducing a channel clock in synchronism with data read from a disk-shaped recording medium driven for rotation, and is particularly suitable for playback of a plurality of kinds of disk-shaped recording media in different recorded data formats.

CD (Compact Disk), or a playback-only disk on which audio data is recorded, has been widely spread since a long time ago, and disks conforming to CD format, including CD-ROM and CD-R, have recently been spread.

Also, a disk medium referred to as DVD (Digital Video Disk/Digital Versatile Disk), which has the same disk diameter as CD, for example, but has a higher recording density than CD, has recently been spread.

In this context, reproducing apparatus configured to be able to play back disks conforming to the CD format and disks conforming to DVD format, for example, have been developed, and are also known.

As is well known, CLV (constant linear velocity) is employed as a method of controlling the rotation driving of CD and DVD. Therefore, in order to demodulate a signal reproduced from these disks by an optical system, it is necessary to reproduce a channel clock of a frequency corresponding to a bit cycle of the signal.

It is widely known that a phase-locked loop circuit (hereinafter referred to as a PLL circuit) is used to reproduce the channel clock. Such a PLL circuit reproduces the clock by being supplied with a signal read from a disk. The PLL circuit is also used to effect CLV control of the disk at a required rotational speed.

A recorded signal format differs between CD and DVD, and frequencies of channel clocks defined for CD and DVD are different from each other. Thus, a current reproducing apparatus capable of playing back CD and DVD has two systems configured for CD and DVD, respectively, as a PLL circuit for generating a channel clock.

The necessity for providing the two PLL circuit systems as described above increases the number of parts, thereby resulting in an increase in cost, and also adjustment of reproduction performance requires more labor. In addition, separate control systems corresponding to the two PLL circuit systems need to be provided as firmware of the reproducing apparatus. Thus, the provision of a plurality of PLL circuit systems has various disadvantages.

SUMMARY OF THE INVENTION

It is an object of the present invention to provide a phase-locked loop circuit for properly reproducing a channel clock in synchronism with a reproduced signal in accordance with a plurality of signal formats.

According to an aspect of the present invention, there is provided a phase-locked loop circuit for reproducing a channel clock in synchronism with data read from a disk-shaped recording medium driven for rotation. The phase-locked loop circuit includes a frequency dividing means inserted in a desired signal path within the phase-locked loop circuit for dividing frequency of an input signal and a frequency dividing ratio switching means capable of selecting a predetermined frequency dividing ratio set for each of signal formats reproduced from disk-shaped recording media of at least two different standards.

Preferably, the predetermined frequency dividing ratio is set on the basis of a relation between a reference clock frequency and a channel clock frequency corresponding to each of the signal formats.

As described above, according to the present invention, in the PLL circuits for reproducing a channel clock in synchronism with data read from a disk-shaped recording medium driven for rotation, the frequency dividing ratios of the frequency dividers provided in desired signal paths can be changed according to the reproduced signal format of a CD reproduced signal or a DVD reproduced signal, for example.

Although the frequency of the channel clock in synchronism with the reproduced signal generally differs in different signal formats, the present invention makes it possible to reproduce the channel clock properly in accordance with a plurality of signal formats only by the operation of changing the frequency dividing ratio in a PLL circuit.

In addition, the present invention uses PLL circuits originally configured for a certain disk-shaped recording medium (signal format), for example, and adds a function of selecting frequency dividers to the PLL circuits to thereby make it possible to handle another disk-shaped recording medium (signal format). Therefore, the present invention is also advantageous in terms of production efficiency, production cost and the like.

The above and other objects, features and advantages of the present invention will become apparent from the following description and the appended claims, taken in conjunction with the accompanying drawings in which like parts or elements denoted by like reference symbols.

BRIEF DESCRIPTION OF THE DRAWINGS

FIGS. 5A and 5B are diagrams explaining frame formats of CD and DVD;

FIG. 7 is a diagram explaining signal parameters for CD playback and DVD playback applied to the PLL circuits according to the present embodiment; and FIG. 8 is a diagram explaining a relation between playback speed and frequency dividing ratio of a CLV control system in the PLL circuits according to the present embodiment.

DETAILED DESCRIPTION OF THE PREFERRED EMBODIMENT

Figure 1:
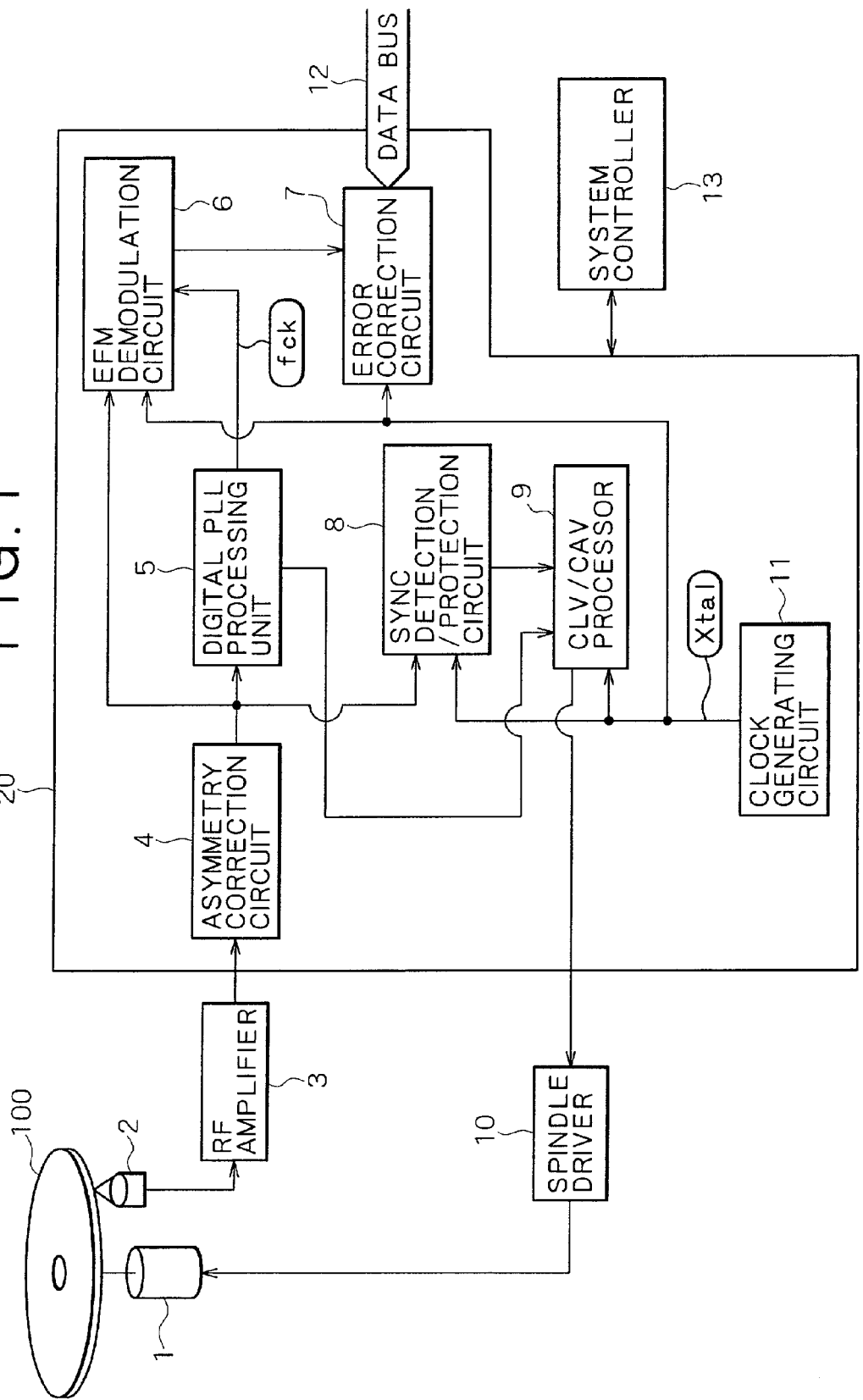
FIG. 1 is a block diagram showing a configuration of a reproducing apparatus having PLL circuits according to an embodiment of the present invention.

FIG. 1 schematically shows a configuration of a reproducing apparatus having PLL circuits according to an embodiment of the present invention. The reproducing apparatus shown in FIG. 1 is configured so as to be able to play back both a CD and a DVD. FIG. 1 mainly shows parts related to operation of the PLL circuit according to the present embodiment, and does not show configuration of a tracking servo control system and a focus servo control system, for example.

A disk 100 in the reproducing apparatus shown in FIG. 1 is a CD or a DVD. As to the CD, not only a CD-DA (CD-Digital Audio) but also a CD-ROM, for example, can be played back as the disk 100 shown in the figure.

The disk 100 is mounted on a turntable, and is driven for rotation at a CLV (constant linear velocity) by a spindle motor 1 during recording/reproducing operation. Then, an optical pickup 2 reads pits formed on the disk 100.

Though not shown, as is well known, the optical pickup 2 includes: a laser diode serving as a source of laser light; a photodetector for detecting reflected light; an object lens serving as an output terminal of the laser light; and an optical system for irradiating a recording surface of the disk with the laser light via the object lens and directing the reflected light to the photodetector.

Information of the light reflected from the disk 100 is for example detected by the photodetector within the optical pickup 2, converted into an electric signal (received light signal) corresponding to the amount of light received, and then supplied to an RF amplifier 3.

The RF amplifier 3 performs required arithmetic processing and the like on the received light signal inputted thereto to thereby generate necessary signals. The RF amplifier 3 for example generates a reproduced RF signal to provide reproduced data, various servo signals for servo control and the like.

The reproduced RF signal generated by the RF amplifier 3 is inputted to an asymmetry correction circuit 4 within a digital signal processing unit 20.

The reproduced RF signal inputted to the asymmetry correction circuit 4 is subjected to asymmetry correction and binarized, whereby a reproduced signal of a CD is converted into a so-called EFM signal (8–14 modulation signal), and a reproduced signal of a DVD is converted into an EFM+ signal (8–16 modulation signal). The signal is then inputted from a branch point to a digital PLL processing unit 5, an EFM demodulation circuit 6, and a sync detection/protection circuit 8.

The EFM signal or the EFM+ signal inputted to the EFM demodulation circuit 6 is subjected to EFM demodulation by the EFM demodulation circuit 6. That is, the EFM demodulation circuit 6 performs 14–8 conversion processing or 16–8 conversion processing. Data obtained by the EFM demodulation by the EFM demodulation circuit 6 is transferred to an error correction circuit 7. The error correction circuit 7 performs error correcting processing and de-interleaving processing on the data transferred thereto while buffering the transferred data. The thus processed data can be outputted via a data bus 12, for example.

The digital PLL processing unit 5 has PLL circuits in three stages, as described later, and the PLL circuit in the final stage is a digital PLL circuit. The digital PLL processing unit 5 is configured so as to enable playback of both a CD and a DVD.

The digital PLL processing unit 5 is supplied with the EFM signal and operates the PLL circuits in the three stages, thereby outputting a channel clock fck in synchronism with the EFM signal. The channel clock fck is used as an operating clock for the EFM demodulation circuit 6, for example, whereby operating timing of the EFM demodulation circuit 6 coincides with transfer rate of the reproduced data based on rotational speed of the spindle motor 1.

The digital PLL processing unit 5 also outputs a phase error signal for controlling spindle rotation obtained by using a signal obtained by the operation of the PLL circuits, the EFM signal inputted thereto and the like.

The phase error signal is inputted to a CLV/CAV processor 9. The CLV/CAV processor 9 generates a control signal for changing the rotational speed of the spindle motor 1 according to a phase error indicated by the phase error signal. A spindle driver 10 generates a motor driving signal on the basis of the control signal, and then supplies the motor driving signal to the spindle motor. Thus, the spindle motor 1 is controlled so as to rotate at a desired CLV velocity, for example.

The sync detection/protection circuit 8 performs operation for detecting frame sync from the EFM signal inputted from the asymmetry correction circuit 4 on the basis of a reference clock Xtal inputted from a clock generating circuit 11, for example. Sync patterns defined by the formats of the CD and the DVD will be described later.

The sync detection/protection circuit 8 also performs frame sync interpolation processing, window protection processing and the like in case a frame sync pattern in the data is lost as a result of a dropout or the effect of jitter, or in case identical frame sync patterns are detected.

The clock generating circuit 11 generates the reference clock Xtal on the basis of an oscillation frequency signal from a crystal oscillator, for example. The reference clock is to be used in the sync detection/protection circuit 8 described above and other functional circuit parts.

A system controller 13 is formed with a microcomputer and the like, and performs control processing as required according to necessary operation to be performed by each of functional circuit parts forming the reproducing apparatus.

The frame formats of a CD and a DVD, which are disk media to be played back by the reproducing apparatus shown in FIG. 1, will next be described with reference to FIGS. 5A and 5B and FIG. 6.

The CD will be described first.

As is well known, the smallest unit of data recorded on a CD is a frame. To be more precise, the frame is also referred to as an EFM (Eight to Fourteen Modulation) frame.

The structure of one such frame (EFM frame) is shown in FIG. 5A.

One frame is formed by 588 channel bits, and first 24 channel bits form a sync pattern. The sync pattern has specific inversion intervals of 11T+11T+2T (three inversions). The frame includes an EFM word of 14 channel bits subsequent to the sync pattern, and a margin bit of three channel bits disposed between EFM words. The 14 channel bits subsequent to the sync pattern form a subcode area, and thereafter main data and parity are allocated to EFM words of 14 channel bits each by a predetermined rule.

The frame structure of a DVD is shown in FIG. 5B.

One frame in DVD format is formed by 1488 channel bits, and first 32 channel bits form a sync pattern area. A subsequent area of 1456 channel bits has continuous word units of 16 channel bits each, in which units data is stored. To make sure, the DVD format uses EFM+ modulation, which converts a word as a unit of eight bits into a word of 16 bits.

Figure 6:
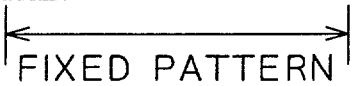
FIG. 6 is a diagram explaining a frame sync pattern as a DVD format.

As the sync pattern formed by 32 channel bits, eight sync codes SY0 to SY7 having different bit patterns are defined in each of states 1 to 4, as shown in FIG. 6. Thus, sync codes of 4×8=32 patterns are defined. A sync code having an appropriate bit pattern is selected from the sync codes on the basis of context with preceding and succeeding data, for example, and then stored in the sync pattern area shown in FIG. 5B.

As is understood from FIG. 6, the 32 sync patterns have a common and specific pattern in the last 19 bits with inversion intervals of 14T+4T. Thus, the 32 sync codes all have a specific inversion interval of 14T without exception.

The reproducing apparatus according to the present embodiment is characterized by the configuration of the PLL circuits (digital PLL processing unit 5) for enabling reproduction of both the CD and the DVD having different formats as described above. Specifically, in the present embodiment, the PLL circuits are not provided separately for each of the CD and the DVD, but one PLL circuit is shared for reproduction of the CD and the DVD.

Prior to description of the PLL circuits of the present embodiment, signal parameters for the CD and the DVD as required in signal processing of the PLL circuits will be described.

FIG. 7 shows a comparison of required signal parameter values for the CD with required signal parameter values for the DVD. The parameter values in both cases are presented supposing a case of a single-speed CLV, a standard speed.

The parameter values for the CD are as follows.

Since the CD format uses the EFM modulation method, an RF signal pattern is a run length limited code having a minimum inversion interval 3T to a maximum inversion interval 11T. Channel clock frequency fck=4.3218 MHz.

Sync frame (EFM frame) length Tsync is 588 channel bits, as shown in FIG. 5A, and sync frame frequency fsync=7.35 KHz.

A sync code pattern is a fixed pattern of 11T+11T+2T, as shown in FIG. 5A.

The frequency of the reference clock Xtal, which is a clock of a crystal system and generated by the clock generating circuit 11, is Xtal=16.9344 MHz. The frequency of a channel clock generation reference signal Vclk corresponding to the reference clock Xtal is also Vclk=16.9344 MHz±α.

A relation between the sync frame frequency fsync and the reference clock Xtal can be represented by:

$$fsync = Xtal/2304 \qquad \text{(equation 1)}$$
$$= 16.9344 \text{ MHz}/2304$$
$$= 7.35 \text{ KHz}$$

A relation between the channel clock frequency fck and the sync frame frequency fsync is:

$$fck = fsync \times Tsync \qquad \text{(equation 2)}$$
$$= 7.35 \text{ KHz} \times 588$$
$$= 4.3218 \text{ MHz}$$

As is understood from the above (equation 1) and (equation 2), the frequency of the reference clock Xtal is set on the basis of the transfer rate (that is, sync frame frequency fsync, channel clock frequency fck and the like) of a signal in the CD format.

Next, the parameter values for the DVD are as follows.

Since the DVD format uses the EFM+ modulation method, an RF signal pattern has a minimum inversion interval 3T to a maximum inversion interval 11T. Since the fixed pattern of 14T is obtained in the sync pattern as shown in FIG. 5B, however, the signal consequently has inversion intervals of 3T to 11T and 14T.

Channel clock frequency fck is 26.16 MHz, and sync frame length Tsync is 1488T. Sync frame frequency fsync is:

$$fsync = fck/Tsync \qquad \text{(equation 3)}$$
$$= 26.16 \text{ MHz}/1488$$
$$\approx 17.58 \text{ KHz}$$

As described with reference to FIG. 5B and FIG. 6, there are 32 sync patterns including the fixed pattern of 14T+4T.

As the frequency of a reference clock Xtal for the DVD, Xtal=16.9344 MHz, which is the same as for the CD, is used. Therefore, the frequency of a channel clock generation reference signal corresponding to the reference clock Xtal is also Vclk=16.9344 MHz±α.

As is understood from the signal processing parameters for the CD, the values of Xtal=16.9344 MHz and Vclk=16.9344 MHz±α are set on the basis of the sync frame frequency fsync for the CD. Therefore, to be exact, the values are different from a reference clock frequency and a frequency of the channel clock generation reference signal to be used as signal parameters for the DVD. However, since the present embodiment forms PLL circuits adapted for playback of both the CD and the DVD by using PLL circuits originally configured for only CD playback, as described later, the parameter values of the frequencies of the reference clock Xtal and the channel clock generation reference signal vclk set for the CD are also used for the DVD as they are. Thus, in DVD playback, specific signal frequencies are somewhat different from those of the DVD format. This will be described later.

The PLL circuits according to the present embodiment will be described below on the basis of the above signal parameter conditions for the CD and the DVD. The PLL circuits according to the present embodiment are the digital PLL processing unit 5 shown in FIG. 1.

Figure 2:
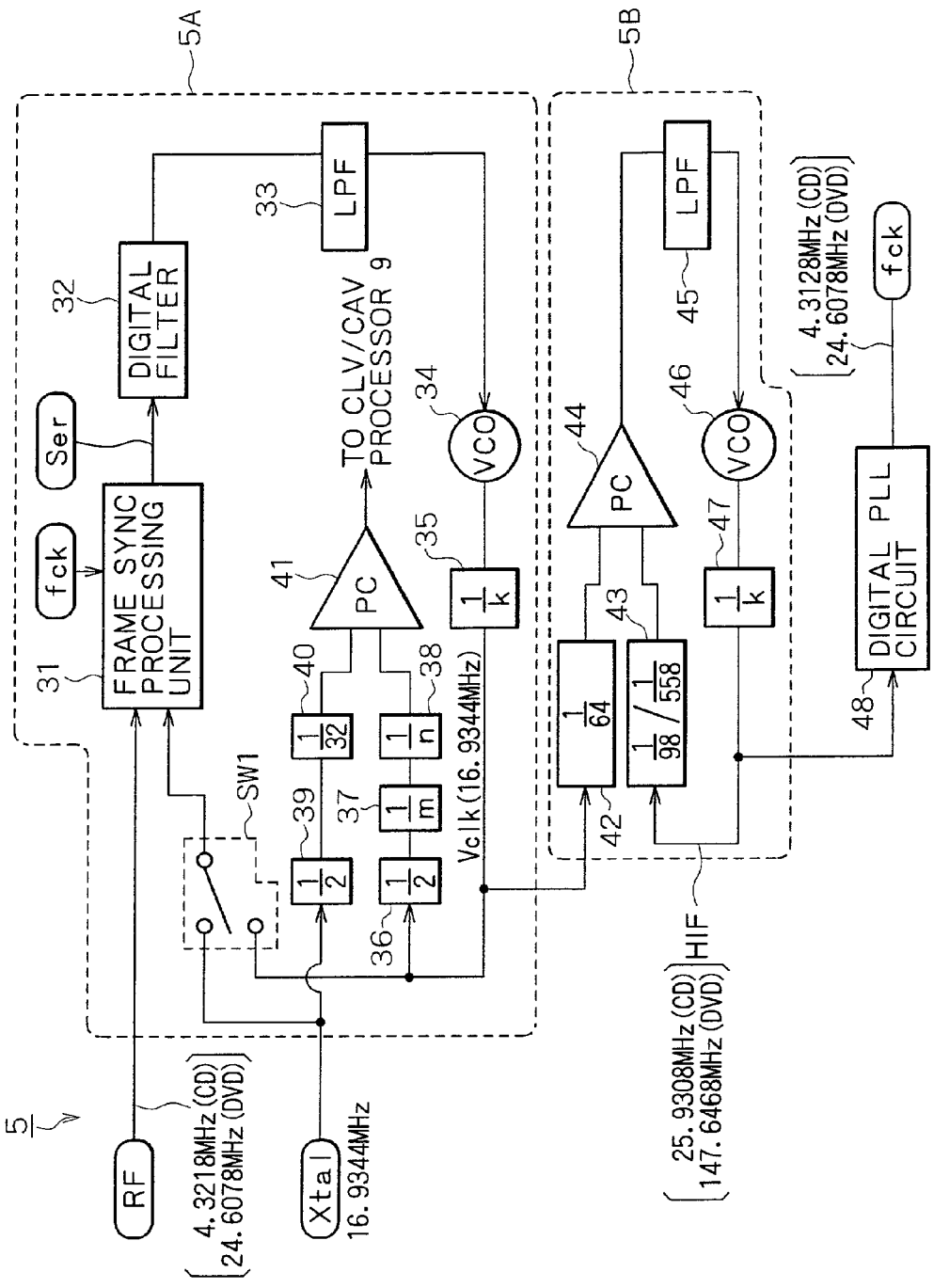
FIG. 2 is a block diagram showing an internal configuration of a digital PLL processing unit, or the PLL circuits according to the embodiment of the present invention.

FIG. 2 shows an internal configuration of the digital PLL processing unit 5. As described above, the digital PLL processing unit 5 forms a loop for rotation control (CLV control) of the spindle motor 1, and also performs processing for generating the channel clock fck.

As shown in FIG. 2, the digital PLL processing unit 5 has a three-stage PLL circuit system including a system PLL circuit 5A, an HIF-PLL circuit 5B, and a digital PLL circuit 48. The system PLL circuit 5A generates the channel clock generation reference signal Vclk, and also effects rotation control of the spindle motor. The HIF-PLL circuit 5B generates a high-frequency signal HIF serving as an input signal to the digital PLL circuit 48 on the basis of the channel clock generation reference signal Vclk. The digital PLL circuit 48 generates the channel clock fck in synchronism with the reproduced RF signal on the basis of the high-frequency signal HIF.

The RF signal binarized by the asymmetry correction circuit 4 (FIG. 1) and inputted to the digital PLL processing unit 5 is inputted to a frame sync processing unit 31 within the system PLL circuit 5A.

The frame sync processing unit 31 performs required frame sync processing on the basis of the RF signal inputted thereto, as later described, and then outputs an error signal Ser necessary for spindle rotation control.

Also, the channel clock fck is inputted to the frame sync processing unit 31. Furthermore, the reference clock Xtal or the channel clock generation reference signal Vclk is inputted to the frame sync processing unit 31 via a switch SW1. When the reference clock Xtal is inputted via the switch SW1, the digital PLL processing unit 5 operates in normal mode in which a capture range is not extended. When the channel clock generation reference signal Vclk is inputted, on the other hand, the digital PLL processing unit 5 operates in so-called wide capture mode in which the capture range can be extended and locked. Description below will be made assuming that the digital PLL processing unit 5 operates in normal mode.

The error signal Ser is converted into a low-frequency signal having a level corresponding to an error via a digital filter 32 and an LPF 33, and then the signal is inputted to a VCO 34. The VCO 34 outputs an oscillating signal whose frequency is variably controlled by a voltage value of the low-frequency signal.

The frequency signal outputted from the VCO 34 is passed through a frequency divider 35 having a frequency dividing ratio 1/k, and then outputted as the channel clock generation reference signal Vclk.

The channel clock generation reference signal Vclk is further passed through frequency dividers 36, 37, and 38, and then inputted to a phase comparator 41.

The frequency divider 36 is provided to divide the frequency of the input signal by 2 with an object of obtaining sufficient performance as operating rate of the system PLL circuit 5A, for example. A frequency divider 39 to be described later also has a frequency dividing ratio of 1/2 for the same reason. The frequency dividers 37 and 38 have frequency dividing ratios of 1/m and 1/n, respectively. By changing the setting values of m and n, it is possible to variably control reproduction speed arbitrarily, as described later.

The phase comparator 41 is supplied with a frequency-divided signal obtained by dividing the frequency of the channel clock generation reference signal Vclk via the frequency dividers 36, 37, and 38, and supplied with a frequency-divided signal as a reference obtained by dividing the frequency of the reference clock Xtal via frequency dividers 39 (frequency dividing ratio 1/2) and 40 (frequency dividing ratio 1/32). The phase comparator 41 compares the phases of the inputted frequency-divided signals.

The phase comparator 41 outputs resulting phase error information to the CLV/CAV processor 9. The CLV/CAV processor 9 generates a spindle control signal for controlling spindle rotational speed on the basis of the phase error signal, and then supplies the spindle control signal to the spindle driver 10. Such operation of the system PLL circuit 5A in a locked state of the digital PLL processing unit 5 means that spindle rotation control (CLV control) to a desired rotational speed is properly effected. Also, the channel clock generation reference signal Vclk at 16.9344 MHz is obtained regardless of whether the reproducing apparatus plays back a CD or a DVD.

The frequency of the channel clock generation reference signal Vclk is divided by a frequency divider 42 in the HIF-PLL circuit 5B, and the frequency-divided channel clock generation reference signal Vclk is inputted to a phase comparator 44. The phase comparator 44 is also supplied with a frequency-divided signal obtained by dividing the frequency of an output of a VCO 46 via a switching frequency divider 43.

A frequency dividing ratio of 1/64 is set in the frequency divider 42. The frequency divider 43 is switched by a configuration to be described later between a frequency dividing ratio of 1/98, which is set during CD playback, and a frequency dividing ratio of 1/558, which is set during DVD playback. A reason for thus setting these frequency dividing ratios will be described later.

The phase comparator 44 compares the phase of the frequency-divided signal obtained from the channel clock generation reference signal Vclk with that of the frequency-divided signal obtained by dividing the frequency of the output of the VCO 46 via the switching frequency divider 43, and then outputs a resulting phase error signal to an LPF 45. The LPF 45 provides a low-frequency signal having a level corresponding to a phase error, and oscillation frequency of the VCO 46 is controlled by the level of the low-frequency signal.

The frequency of the frequency signal outputted from the VCO 46 is divided by a frequency divider 47 having a frequency dividing ratio of 1/k, whereby a resulting signal is obtained as the high-frequency signal HIF. The signal is inputted to the phase comparator 44 via the switching frequency divider 43, as described above. A variable k of the frequency divider 47 is changed through control of the system controller 13, for example, so as to obtain a high-frequency signal HIF=25.9308 MHz for CD playback and a high-frequency signal HIF=147.6488 MHz for DVD playback.

Such a loop in a locked state of the PLL circuits stably provides the high-frequency signal HIF at the required frequency (CD: 25.9308 MHz/DVD: 147.6488 MHz) for each of CD playback and DVD playback.

The high-frequency signal HIF is inputted to the digital PLL circuit 48. When the high-frequency signal HIF=25.9308 MHz for CD playback is inputted to the digital PLL circuit 48, the digital PLL circuit 48 generates and outputs a channel clock fck of 4.3218 MHz. When the high-frequency signal HIF=147.6488 MHz for DVD playback is inputted to the digital PLL circuit 48, the digital PLL circuit 48 generates and outputs a channel clock fck of 24.6078 MHz.

Figure 3:
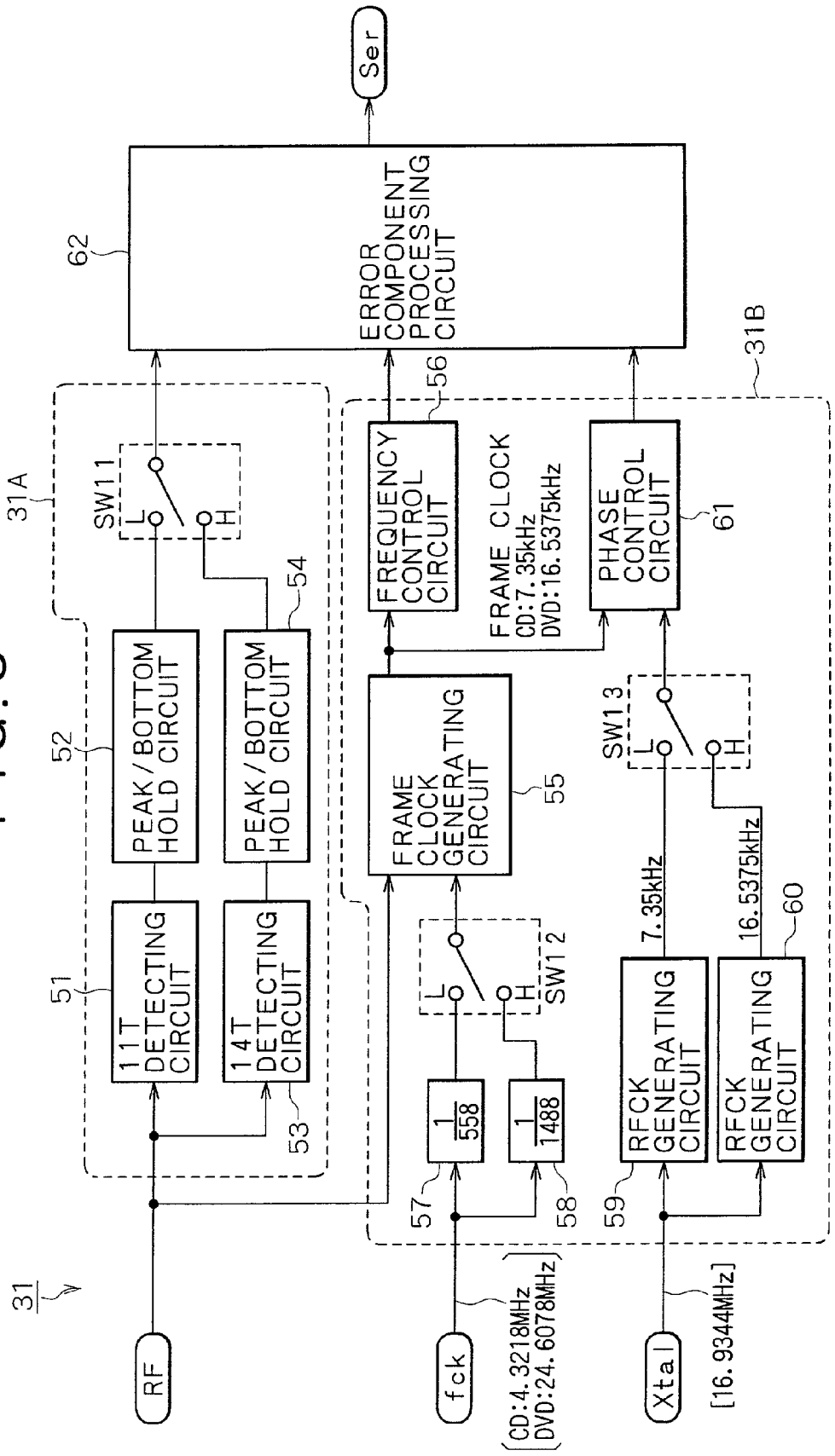
FIG. 3 is a block diagram showing a configuration of a frame sync processing unit provided within the digital PLL processing unit.

Next, FIG. 3 shows an internal configuration of the frame sync processing unit 31 shown in FIG. 2.

Three switches SW11, SW12, and SW13 provided within the frame sync processing unit 31 shown in FIG. 3 are turned to a terminal L side during CD playback and to a terminal H side during DVD playback under control of the system controller 13 not shown in the figure, for example.

In a CLV servo system, so-called rough servo control is generally effected at a start of rotation of the spindle motor 1, for example, to control the rotational speed of the spindle motor until the PLL circuits are brought into a capture range. In a locked state of the PLL circuits, the rough servo circuit system is switched to a higher-precision CLV control circuit system to control the rotational speed of the disk at a constant linear velocity.

Therefore, a circuit configuration of the frame sync processing unit 31 shown in FIG. 3 is formed by a rough servo control system 31A and a normal servo control system 31B for effecting higher-precision control of spindle rotation, as shown in the figure.

In this case, in the rough servo control system 31A, an 11T detecting circuit 51 and a peak/bottom hold circuit 52 form a rough servo system for CD playback, while a 14T detecting circuit 53 and a peak/bottom hold circuit 54 form a rough servo system for DVD playback.

Specifically, during CD playback, the 11T detecting circuit 51 detects a pattern of 11T—11T specific as a sync pattern from the binarized RF signal. Then, the peak/bottom hold circuit 52 measures length of the 11T, and outputs the measured value to an error component processing circuit 62 via the switch SW11.

Similarly, during DVD playback, the 14T detecting circuit 53 and the peak/bottom hold circuit 54 detect 14T specific as a sync pattern from the binarized RF signal, and then output a measured value obtained by measuring length of the 14T to the error component processing circuit 62.

The error component processing circuit 62 compares the measured value thus obtained with a predetermined target value, and then outputs an error signal Ser corresponding to the period of rough servo control. On the basis of the error signal Ser, the digital PLL processing unit 5 operates so as to converge into a locked state. CLV pull-in control is thus effected.

When the rough servo control is completed and the frame sync processing unit 31 is switched to normal CLV control, the normal servo control system 31B begins operating. An outline of the operation of the normal servo control system 31B is as follows.

The channel clock fck inputted to the frame sync processing unit 31 is inputted from a branch point to a frequency divider 57 and a frequency divider 58. The frequency divider 57 is provided for CD playback. The frequency divider 57 divides the frequency of the channel clock fck=4.3218 MHz by a frequency dividing ratio of 1/588, thereby generates a frequency of 7.35 KHz (=4.3218 MHz/588), and then outputs the frequency to a frame clock generating circuit 55 via the switch SW12.

The frequency divider 58 is provided for DVD playback, and a frequency dividing ratio of 1/1488 is set for the frequency divider 58. The frequency divider 58 divides the frequency of the channel clock fck=24.6078 MHz, thereby generates a frequency signal of 16.5375 KHz (=24.6078 MHz/1488), and then outputs the frequency signal to the frame clock generating circuit 55 via the switch SW12.

The frame clock generating circuit 55 generates a frame clock in synchronism with the RF signal inputted thereto on the basis of the RF signal and the frequency-divided signal inputted thereto via the switch SW12. Specifically, as a clock in synchronism with the RF signal in frame units, the frame clock generating circuit 55 generates a frame clock of 7.35 KHz during CD playback, and generates a frame clock of 16.5375 KHz during DVD playback.

A frequency control circuit 56 measures an actual frequency of the frame clock inputted thereto, and outputs the measured value to the error component processing circuit 62. The measured value corresponds to rotational frequency of the spindle motor 1.

The reference clock Xtal (=16.9344 MHz) is inputted from a branch point to reference frame clock (RFCK) generating circuits 59 and 60.

The RFCK generating circuit 59 is provided for CD playback. The RFCK generating circuit 59 generates an RFCK having a frequency of exactly 7.35 KHz from the reference clock Xtal, and then outputs the RFCK via the switch SW13. The RFCK generating circuit 60 is provided for DVD playback. Similarly to the RFCK generating circuit 59, the RFCK generating circuit 60 generates an RFCK having a frequency of exactly 16.5375 KHz from the reference clock Xtal, and then outputs the RFCK via the switch SW13.

A phase control circuit 61 detects a frame clock phase error between the frame clock inputted thereto and the RFCK by using the RFCK as a reference. A signal of the phase error is outputted to the error component processing circuit 62. The phase error signal in this case indicates a phase error between frame timing of the RF signal actually obtained and the RFCK.

Thus, the measured value of the frame clock frequency, or rotational frequency information inputted from the frequency control circuit 56, and phase error information from the phase control circuit 61 are inputted from the normal servo system 31B to the error component processing circuit 62 as information on the rotation of the spindle motor. The error component processing circuit 62 for example outputs the error signal Ser generated on the basis of these pieces of information.

Then, the PLL circuit system shown in FIG. 2 operates on the basis of the error signal Ser, thereby controlling the rotation of the spindle motor 1 so as to obtain the RF signal having accurate frame timing. That is, CLV control is effected.

Figure 4:
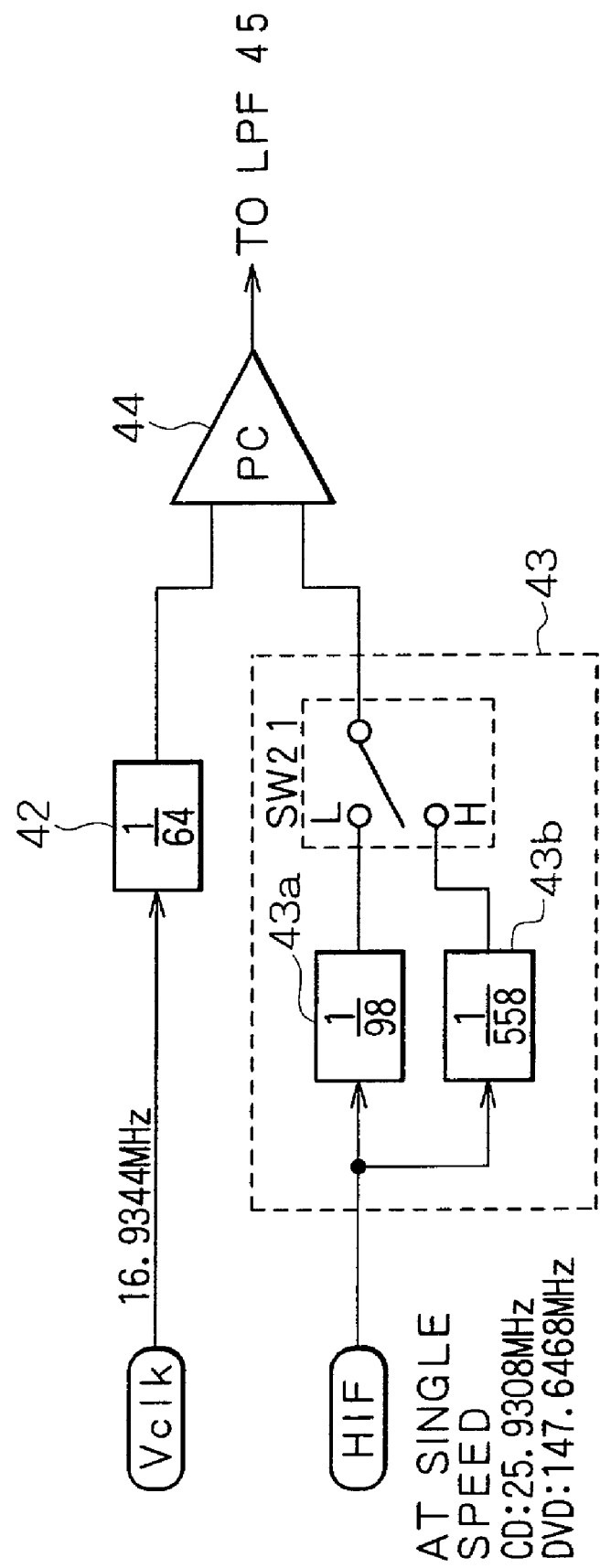
FIG. 4 is a block diagram showing an internal configuration of a switching frequency divider for dividing the frequency of a high-frequency signal HIF.

FIG. 4 shows an internal configuration of the switching frequency divider 43 shown in FIG. 2. In FIG. 4, the same parts as in FIG. 2 are identified by the same reference numerals, and their description will be omitted.

As described with reference to FIG. 2, the switching frequency divider 43 has a frequency dividing ratio of 1/98 set for CD playback and a frequency dividing ratio of 1/558 set for DVD playback.

To enable such switching, the switching frequency divider 43 is provided with a frequency divider 43a having a frequency dividing ratio of 1/98, a frequency divider 43b having a frequency dividing ratio of 1/558, and a switch SW21, as shown in FIG. 4. The high-frequency signal HIF is inputted from a branch point to the frequency divider 43a and the frequency divider 43b. Signals obtained by dividing the frequency of the high-frequency signal HIF by the frequency divider 43a and the frequency divider 43b are outputted to a terminal L and a terminal H of the switch SW21, respectively. The switch SW21 alternatively selects the terminal L or H to input a signal to the phase comparator 44. With such a configuration, under control of the system controller 13, for example, the switch SW21 is turned to the terminal L during CD playback to thereby input the signal obtained by dividing the frequency of the high-frequency signal HIF by the frequency dividing ratio of 1/98 to the phase comparator 44. The switch SW21 is turned to the terminal H during DVD playback to thereby input the signal obtained by dividing the frequency of the high-frequency signal HIF by the frequency dividing ratio of 1/558 to the phase comparator 44.

The digital PLL processing unit 5 in the present embodiment employs the above-described configuration to deal with reproduction of a CD and a DVD. However, for example, according to the signal parameters shown earlier in FIG. 7, the sync frame frequency fsync of DVD≈17.58 KHz, whereas the sync frame frequency fsync (frame clock) during DVD playback in the actual digital PLL processing unit 5 is 16.5375 KHz. In addition, the channel clock frequency fck of DVD shown in FIG. 7 is 26.16 MHz, whereas the actual channel clock frequency fck obtained in the digital PLL processing unit 5 is 24.6078 KHz.

Thus, the signal transfer rate (that is, fsync and fck) of the digital PLL processing unit 5 in the present embodiment during DVD playback is somewhat different from the transfer rate to be obtained from the signal format of DVD. Accordingly, reasons for the difference and the setting of signal parameters based on the reasons will next be described.

The digital PLL processing unit 5 in the present embodiment is formed from digital PLL circuits originally adapted for CD playback. Therefore, as shown in FIG. 2 and FIG. 3, the rough servo circuit system for detecting 14T is provided for the PLL circuits for CD playback. Also, frequency dividers having frequency dividing ratios adapted for DVD are provided in desired signal paths, thereby enabling switching between the frequency dividers for DVD and the frequency dividers for CD.

Thus, use of the PLL circuits originally designed for CD enables CD playback without a problem. DVD playback is readily made possible only by adding the configuration as described above for selecting the frequency dividing ratios of the necessary frequency dividers. In addition, when the frequency dividing ratios are selected by means of switches in practice, it is possible to simplify control processing of firmware, and thus prevent a problem of making processing load particularly heavy.

Moreover, since the PLL circuits or the digital PLL processing unit 5 in the present embodiment employs the digital PLL circuit 48, it is possible to omit adjusting operations such for example as fitting in constants as required for analog PLL circuits. Conventionally, on the other hand, PLL circuits for CD are provided separately from PLL circuits for DVD in order to enable reproduction of both CD and DVD, for example, and as PLL circuits for DVD, in particular, analog PLL circuits have been employed.

However, since the fundamental configuration of the PLL circuits according to the present embodiment is based on signal parameters originally adapted for CD playback, the reference clock Xtal=16.9344 MHz inputted to the phase comparator 41 as a reference in the system PLL circuit 5A is set on the basis of the signal format of CD, as described with reference to FIG. 7. Thus, the reference clock Xtal does not conform to the signal format of DVD.

The digital PLL processing unit 5 according to the present embodiment therefore needs to be configured so that a channel clock is properly reproduced by using the reference clock Xtal=16.9344 MHz also as a reference for DVD playback.

Accordingly, the present embodiment determines signal parameters for the digital PLL processing unit 5 to enable DVD playback as follows, thereby resulting in the actual signal transfer rate (fsync and fck) as shown earlier in FIG. 2 or FIG. 3.

As is understood from the above description, the digital PLL processing unit 5 according to the present embodiment is required to enable CLV control during DVD playback by using the reference clock Xtal=16.9344 MHz originally set for CD. In actuality, however, the value of the reference clock Xtal=16.9344 MHz is not divisible by the sync frame frequency fsync=17.58 KHz of DVD at a single-speed CLV. Hence, a frequency that can be generated from (that can divide) the reference clock Xtal=16.9344 MHz and is close to the value of 17.58 KHz defined by the format will be determined as the sync frame frequency fsync in the circuit.

The present embodiment divides the frequency of the reference clock Xtal by 1024, which is expressed as:

$$fsync = Xtal/1024 \quad \text{(equation 4)}$$
$$= 16.9344 \text{ MHz}/1024$$
$$= 16.5375 \text{ KHz}(\approx 17.58 \text{ KHz})$$

Thus, the sync frame frequency fsync in the actual circuit is 16.5375 KHz.

Since the channel clock frequency fck is obtained by multiplying the sync frame frequency fsync by the sync frame length 1488T, the actual channel clock frequency fck in the circuit during DVD playback is:

$$fck = fsync \times Tsync \quad \text{(equation 5)}$$
$$= 16.5375 \text{ KHz} \times 1488$$
$$= 24.6078 \text{ MHz}(\approx 26.16 \text{ MHz})$$

Thus, the sync frame frequency fsync=16.5375 KHz and the channel clock frequency fck=24.6078 MHz are determined as signal parameters in the circuit. Accordingly, the RFCK generating circuit 60 shown in FIG. 3, for example, provides an RFCK corresponding to the sync frame frequency fsync=16.5375 KHz by dividing the frequency of the reference clock Xtal by 1024. Also, a frequency dividing ratio of 1/1488 is set in the frequency divider 58 supplied with the channel clock fck to generate a frame clock for DVD, whereby a frequency-divided signal of 16.5375 KHz is obtained.

Consequently, a frequency of 24.6078 MHz, which is different from the 26.16 MHz according to the signal format, is obtained as the channel clock frequency fck for DVD in the digital PLL circuit 48.

Then, the conditions of the signal parameters in the actual circuit obtained by the above (equation 4) and (equation 5) are applied to the HIF-PLL circuit 5B of the channel clock generating system as follows.

The digital PLL circuit 48 in the present embodiment is configured to operate by being supplied with a frequency signal having a frequency six times the channel clock frequency fck as an operating clock. Hence, required as the high-frequency signal HIF or the operating clock (that is, the output of the VCO 46 (see FIG. 2)) for DVD playback is:

$$HIF = fck \times 6 \quad \text{(equation 6)}$$
$$= 24.6078 \text{ MHz} \times 6$$
$$= 147.6488 \text{ MHz}$$

The reference clock Xtal and the high-frequency signal HIF have the following relation with each other:

$$Xtal : HIF = 16.9344 \text{ MHz} : 147.6488 \text{ MHz} \quad \text{(equation 7)}$$
$$= 32 : 279$$

Thus, a signal obtained by dividing the frequency of the channel clock generation reference signal Vclk (=16.9344 MHz) by 32 and a signal obtained by dividing the frequency of the high-frequency signal HIF by 279 suffice as the signals to be inputted to the phase comparator 44 in the HIF-PLL circuit 5B. However, in consideration of making speed in DVD playback about six times higher as compared with CD playback, the present embodiment practically adds a circuit with a frequency dividing ratio of 1/2 in a stage preceding the phase comparator 44 in order to raise the limit of operating speed of the system on the high-frequency signal HIF side. Hence, in practice, the frequencies of the channel clock generation reference signal Vclk and the high-frequency signal HIF are divided as follows:

$$Vclk = 2 \times 32 \quad \text{(equation 8)}$$
$$= 2 \times 2 \times 2 \times 2 \times 2 \times 2$$
$$= 64 \text{ (frequency dividing ratio } 1/64)$$

$$HIF = 2 \times 279 \quad \text{(equation 9)}$$
$$= 2 \times 3 \times 3 \times 31$$
$$= 558 \text{(frequency dividing ratio } 1/558)$$

The circuit of the frequency divider 42 shown in FIG. 2 is formed so as to have a total frequency dividing ratio of 1/64 on the basis of the equation 8. Similarly, the circuit of the frequency divider 43b within the switching frequency divider 43 is formed on the basis of the equation 9, and thus the frequency dividing ratio of 1/558 is set in the frequency divider 43b.

As for speed of disk playback, as described above, the frequency dividing ratios of the frequency dividers 37 and 38 for the channel clock generation reference signal Vclk in the system PLL circuit 5A are varied by changing the variables m and n as denominators of the frequency dividing ratios. It is thereby possible to variably control the CLV speed for disk playback with ease.

Specifically, the frequency of the reference clock Xtal=16.9344 MHz inputted to the phase comparator 41 as a reference is divided by 2×32=64 in total by the frequency dividers 39 and 40, whereas the frequency of the channel clock generation reference signal Vclk=16.9344 MHz is divided by 2×m×n by the frequency dividers 36, 37, and 38. Therefore the variables m and n are changed to set a frequency ratio of the frequency-divided signal of the channel clock generation reference signal Vclk to the frequency-divided signal (=264.6 KHz =16.9344 MHz/64) obtained from the reference clock Xtal and inputted to the phase comparator 41. It is thus possible to set the CLV speed according to the frequency ratio.

Hence, playback speed Ps1 can be expressed as:

$$Ps1 = (m \times n)/32 \quad \text{(equation 10)}$$

According to the equation 10, the playback speed can be set as single-speed CLV when (m×n)=32.

However, since in the present embodiment, the reference clock Xtal=16.9344 MHz is originally set for CD playback, the accurate playback speed as single-speed CLV cannot be obtained in DVD playback in practice even when (m×n)=32. A relation of an actual playback speed Ps2 of the PLL circuits according to the present embodiment to the playback speed Ps1 expressed by the equation 10 is expressed as follows on the basis of the actual channel clock frequency fck for DVD=24.6078 MHz in the PLL circuits according to the present embodiment and the channel clock frequency fck=26.16 MHz defined by the signal format.

$$Ps2 = Ps1 \times 24.6078 \text{ MHz}/26.16 \text{ MHz} \quad \text{(equation 11)}$$
$$\approx Ps1 \times 0.940$$

Thus, for the PLL circuits according to the present embodiment to enable reproduction at normal single-speed CLV in accordance with the signal format, from the equation 11, the following setting is required.

$$Ps1 = 1/0.940 = 1.063 \quad \text{(equation 12)}$$

Accordingly, the values of the variables m and n may be selected so as to set Ps1=1.063.

A relation between the playback speed Ps1 and the playback speed Ps2 obtained by frequency dividing ratios actually realizable by the variables m and n is shown in FIG. 8.

According to the figure, when a frequency dividing number obtained by m×n=34, the playback speed Ps1=1.0625, and the actual playback speed Ps2=0.999, which is closest to the single-speed CLV.

Although in the case of the present embodiment, perfectly accurate single-speed CLV cannot be realized in DVD playback, an error to the extent described above causes substantially no problem in practice. Moreover, in actual DVD playback, it is conceivable, and is readily possible, to adjust the time axis of output data by CLV or CAV rotation driving at a rotational speed higher than the single-speed CLV and by buffering reproduced data. In this case, data reading rate may be set so as to attain a single-speed data rate after the buffering, and therefore effects of the PLL circuits not operating at accurate single speed do not need to be considered.

It is to be noted that the present invention is not limited to the configuration of the foregoing embodiment, and is susceptible of various changes. For example, in the foregoing embodiment, the configuration of the PLL circuits enabling playback of CD and DVD is taken as an example; however, the present invention is applicable to combination of other disk types. In addition, the number of disk medium types that can be handled by the PLL circuits according to the present invention is not limited to two types, that is, CD and DVD, for example, and the PLL circuits according to the present invention can handle three or more disk medium types.

While a preferred embodiment of the present invention has been described using specific terms, such description is for illustrative purposes only, and it is to be understood that changes and variations may be made without departing from the spirit or scope of the following claims.

What is claimed is:

1. A phase-locked loop circuit for reproducing a channel clock, said phase-locked loop circuit comprising:

a channel clock generation reference signal frequency divider that divides a channel clock generation reference signal;

a switching frequency divider having a switch, a first switching frequency divider and a second switching frequency divider, said first and second switching frequency dividers receiving a high-frequency signal, said first switching frequency divider dividing said high-frequency signal by a first dividing ratio to generate a first divided signal, said second switching frequency divider dividing said high-frequency signal by a second dividing ratio to generate a second divided signal, said switch outputting said first divided signal during playback of a first recording medium and outputting said second divided signal during playback of a second recording medium; and a phase comparator, said phase comparator receiving said divided channel clock generation reference signal and one of said first and second divided signals,
said phase comparator compares the phase of said divided channel clock generation reference signal with one of said first and second divided signals to output a phase error signal.

2. A phase-locked loop circuit as claimed in claim 1, further comprising:
a low-pass filter, said low-pass filter generating a low-frequency signal having a level corresponding to said phase error signal;
a voltage controlled oscillator outputting a frequency signal, the oscillation frequency of said frequency signal being controlled by the level of said low-frequency signal; and
a high-frequency signal frequency divider generating said high-frequency signal from dividing said frequency signal by a variable,
said variable being changed such that said high-frequency signal is at a first frequency during said playback of said first recording medium and is at a second frequency during said playback of said second recording medium.

3. A phase-locked loop circuit as claimed in claim 1, wherein said channel clock is in synchronism with data read from a disk-shaped recording medium driven for rotation.

4. A phase-locked loop circuit as claimed in claim 1, wherein said first recording medium has a standard different than that of said second recording medium.

5. A phase-locked loop, circuit as claimed in claim 1, wherein said first recording medium is a first disk-shaped recording medium and said second recording medium is a second disk-shaped recording medium.

* * * * *